United States Patent
Dalmia et al.

[19]

[11] Patent Number: 5,835,501
[45] Date of Patent: Nov. 10, 1998

[54] BUILT-IN TEST SCHEME FOR A JITTER TOLERANCE TEST OF A CLOCK AND DATA RECOVERY UNIT

[75] Inventors: Kamal Dalmia, Vancouver; Andre Ivanov, Richmond; Brian Donald Gerson, Coquitlam; Curtis Lapadat, Burnaby, all of Canada

[73] Assignee: PMC-Sierra Ltd., Burnaby, Canada

[21] Appl. No.: 607,990

[22] Filed: Mar. 4, 1996

[51] Int. Cl.$^6$ .................................................. G06F 11/00
[52] U.S. Cl. .................. 371/5.1; 371/1; 371/61
[58] Field of Search ................ 371/5.1, 5.2, 1, 371/61, 48; 327/122, 265; 375/371

[56] References Cited

U.S. PATENT DOCUMENTS

| | | | |
|---|---|---|---|
| 4,916,411 | 4/1990 | Lymer | 331/25 |
| 5,239,535 | 8/1993 | Borm et al. | 370/13 |
| 5,515,404 | 5/1996 | Pearce | 376/371 |

*Primary Examiner*—Phung M. Chung
*Attorney, Agent, or Firm*—E. E. Pascal; R. A. Wilkes

[57] ABSTRACT

A jitter test system for a clock and data recovery unit (CRU) is comprised of a data generating apparatus, apparatus for clocking the data generating apparatus with a jittered clock, apparatus for applying a stream of data generated by the data generating apparatus that has been jittered by the jittered clock to an input of the CRU, and apparatus for detecting a bit error rate of a data signal output from the CRU.

13 Claims, 2 Drawing Sheets

| OC/STS-N | f0(Hz) | f1(Hz) | f2(Hz) | f3(KHz) | ft(KHz) | A1(UI pp) | A2(UI pp) | A3(UI pp) |
|---|---|---|---|---|---|---|---|---|
| 12 | 10 | 30 | 300 | 25 | 250 | 0.15 | 1.5 | 15 |

BUILT-IN TEST SCHEME FOR A JITTER TOLERANCE TEST OF A CLOCK AND DATA RECOVERY UNIT

FIELD OF THE INVENTION

This invention relates to the field of test systems for clock and data recovery circuits.

BACKGROUND TO THE INVENTION

Integrated circuit clock and data recovery integrated circuits (CRUs) are often found in high speed local and wide area communication and computer networks. These CRUs require testing in order to screen out defective and out of specification parts.

A standard way of testing a CRU is to supply it with a reference data stream from an external source and to observe recovered data from the CRU to establish a bit error rate (BER). The BER is a standard figure of merit for telecommunication systems. Such a test verifies basic CRU functionality in that it verifies the capability of the CRU to recover a clock (signal) from an arbitrary data stream. The recovered clock enables correct recovery of the data. Since this test basically verifies a CRU's ability to "lock" onto the clock frequency used to originally transmit the data stream, it is henceforth referred to as a "frequency test" in this disclosure.

Though it is a fundamental test, a frequency test only verifies part of the set of CRU standard specifications. A frequency test is reasonably simple to implement using external automatic test equipment (ATE), provided the latter has performance capabilities exceeding that of the CRU under test, in particular, with respect to clock and data rates. Such a test can be performed without the requirement of any external circuitry. However, production test time limitations do not allow reasonable BER statistics to be obtained.

A common additional specification for a CRU is tolerance of the CRU to jitter. Jitter is defined in the time domain as the undesirable random, or deterministic time variation of significant events (e.g., rising and/or falling edges) of a digital data stream from a nominal time position. Jitter can be alternatively represented in the frequency domain as undesirable random phase variation of a signal, and hence viewed as phase noise. Jitter tolerance specifications depend on the applications of the CRUs. Typical jitter specifications for a local area network (LAN) are in the time domain, whereas typical wide area network (WAN) jitter specifications use the frequency domain. FIG. 1 is an example of a jitter tolerance specification as given in ANSI T1.105.03-1994, for a Synchronous Optical Network (SONET) element.

In practice, there is no previously known cost-effective production-stage test method for testing for jitter tolerance of high-speed CRUs. Known methods are only applicable for either characterization tests or production test of expensive parts that can tolerate long test times, using dedicated expensive test equipment that can generate data streams with controlled amounts of jitter that are fed to a CRU under test (e.g., industry-standard Microwave Logic SONET/SDH SJ-300 Jitter and Wander Analyzer). The corresponding CRU output (recovered) stream is captured and evaluated using a unit to measure the BER to determine the CRU's jitter tolerance.

The major drawbacks of the aforementioned frequency and jitter tolerance test methodologies are (a) high cost—the requirement for expensive test equipment that must have the same or superior speed and accuracy specifications as the CRU under test; (b) long test times—GPIB overhead, and test equipment specific delays results in long test times; and (c) frequency limitations—most methods of applying jitter to the clock have an effective upper limit of 1 to 5 MHz jitter frequency and cannot source enough jitter to make the parts fail the test.

With the rapidly increasing speeds of clock rates resulting from the advances in IC technology, these drawbacks become increasingly significant, especially for performing volume-production stage testing of CRU frequency and jitter tolerance. More specifically, there are no known effective methods of testing for CRU frequency and jitter tolerance of high-speed CRUs (e.g. 622 MHz) using current industry-standard digital IC production testing equipment that have typical clock rates in the order of a few hundred MHz, (e.g. 100–200 MHz).

SUMMARY OF THE INVENTION

The present invention provides a system and an effective method for high throughput production-stage testing of high-speed fully or partially integrated CRUs. The present invention substantially overcomes the throughput and cost limitations of typical prior art characterization stage test equipment.

The present invention provides a means and method for the built-in self-test (BIST) of CRUs to perform frequency and/or jitter tolerance tests, and means and method for generating a jittered clock signal with specific jitter amplitude and frequency characteristics for the purpose of performing production-stage jitter tolerance tests of CRUs. The method includes the possibility of either a full BIST scheme or one where an external generator is used as a jitter source.

In accordance with an embodiment of the present invention, a jitter test system for a clock and data recovery unit (CRU) is comprised of a data generating apparatus, apparatus for clocking the data generating apparatus with a jittered clock, apparatus for applying a stream of data generated by the data generating apparatus jittered by the jittered clock to an input of the CRU, and apparatus for detecting a bit error rate of a data signal output from the CRU.

In accordance with another embodiment, a method of testing a CRU is comprised of generating a jittered clock, using the jittered clock to generate a test data stream, feeding the test data stream to the CRU under test, recovering a data stream from an output of the CRU, and determining from the data stream from the output of the CRU the number of bit errors contained therein, whereby the number of bit errors provides an indication of the tolerance of the CRU to jitter.

In accordance with another embodiment, a jittering clock generator is comprised of a VCO having a control input, apparatus for applying a predetermined D.C. voltage to the control input, and apparatus for A.C. coupling an A.C. signal to the control signal for frequency or phase modulating a signal generated by the VCO. The D.C. voltage can be derived from a voltage rail, or from a phase comparator if the VCO is used in a phase locked loop.

BRIEF INTRODUCTION TO THE DRAWINGS

A better understanding of the invention will be obtained by considering the detailed description below, with reference to the following drawings, in which:

FIG. 1 is a graph and table illustrating a standard jitter tolerance specification for a SONET element, FIG. 2 is block diagram of an embodiment of the invention, FIG. 3 is a block diagram of a clock synthesis unit (CSU) of the embodiment of FIG. 2, and FIG. 4 is a block diagram of another embodiment of the invention.

DETAILED DESCRIPTION OF THE EMBODIMENTS OF THE INVENTION

Figure 2:
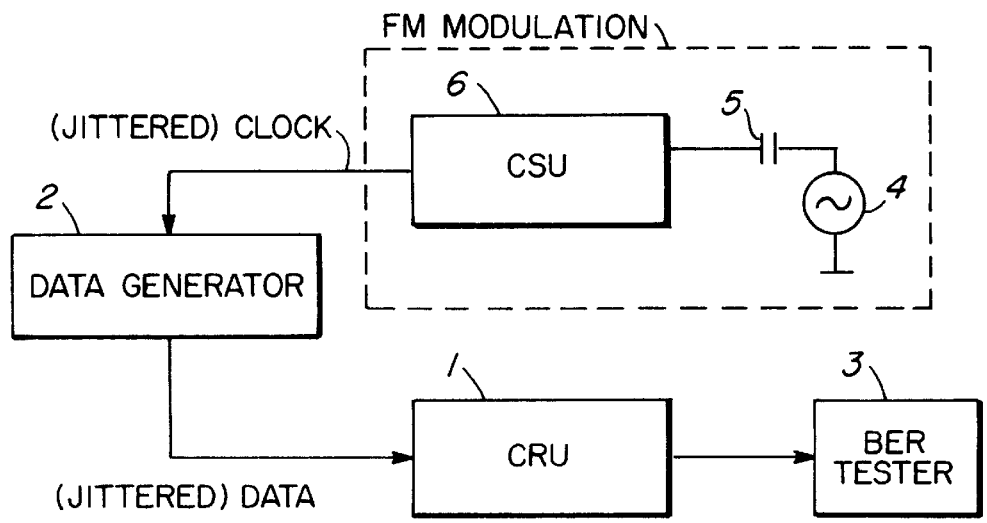

FIG. 2 illustrates a CRU that is under test. A data generator 2 has its output connected to the input of CRU 1. The output of the CRU is connected to the input of a bit error rate detection tester (BER TESTER) 3. A clock synthesis unit (CSU) 6 has its output connected to the clock input of data generator 2.

The data generator 2 generates a data stream in a well known manner, the data timing of which is controlled by a clock signal received at the clock input of the data generator. It is preferred that the data generator generates an arbitrary (pseudo random) data stream. In the present invention the timing of the clock is jittered by frequency or phase modulation.

Frequency or phase modulation of the clock is provided by means of a signal generator 4, preferably a sine wave generator, which has its output A.C. coupled (preferably via capacitor 5) to a control input of the CSU 6. This provides a jitter of known characteristics of frequency or frequency and amplitude on the clock. The result is a jittered clock output, which is applied to the clock input of the data generator 2.

The jitter test determines whether the CRU can correctly recover the data from the data stream that is generated from the specifically jittered clock. The test thus is comprised of the steps of generating a jittered clock, using the jittered clock to generate a test data stream, feeding the test data stream to the CRU that is under test, and determining by the BER TESTER 3 the number of bit errors that arise in the CRU's recovered data stream. The tolerance or lack of tolerance of the CRU to jitter can be thereby established.

Figure 3:
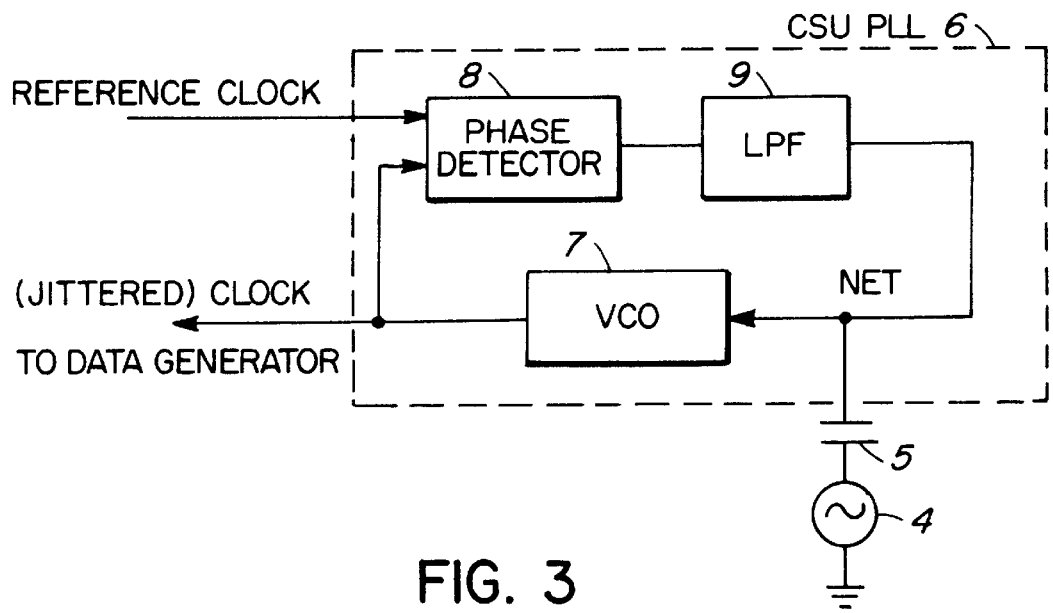

An embodiment of the CSU 6 used in the embodiment of FIG. 2 is illustrated in FIG. 3. A basic element of the CSU is a voltage controlled oscillator (VCO) 7. The VCO has a control input to which the output of the signal generator 4 is coupled via capacitor 5.

The VCO is connected in a phase locked loop, as follows. The output of the VCO 7 is connected to an input of a phase detector 8. A reference clock source is connected to the other input of phase detector 8. The output of the phase detector is connected to the input of a low pass filter (LPF) 9. The output of the LPF is connected to the control input of the VCO 7 with the A.C. coupled output of the signal generator 4.

The conductor leading to the control input of the VCO will be referred to herein as a control network (net), and carries a direct current which is the filtered output of the phase detector 8, filtered in filter 9 in a well known manner, but modulated with the A.C. signal generated in the signal generator 4.

The circuit represents a phase locked loop, which operates in a well known manner at a frequency keyed to the reference clock signal, but additionally in accordance with this invention is frequency or phase modulated by the frequency of the signal output from the signal generator 4, in a manner to be described below. The output of the phase locked loop, that is, the output signal from the VCO 7, is a clock signal which has jitter caused by the modulation of the D.C. control voltage applied to the VCO, resulting in a variable frequency (or phase) of the clock pulses. This signal is applied to the clock input of the data generator 2, which as a result generates data having jitter corresponding to the jitter of the clock signal applied thereto.

Assuming that the CSU used in this test method has a normal mode of operation and purpose other than testing the CRU, it is important that the test circuitry added to it for the CRU test purposes not have any significant negative performance impact on the CSU's normal mode of operation. As the normal mode of operation of the CSU 1 results from the control input signal to the VCO being a D.C. or very low-frequency signal, it has been found to be generally acceptable to add capacitance to the control input without incurring any significant negative performance impact. Therefore, as the normal VCO input is a D.C. signal, the present invention generates a frequency modulated signal at the CSU output by providing a modulating signal of specific amplitude and frequency to the VCO control input.

As a jitter tolerance test requires testing against specified amount of jitter amplitudes at specific frequencies, it is necessary to have a precise control over the modulation signal superimposed on the normal VCO input. The procedure for determining the parameters of the angle (frequency) modulation to yield the desired specific jitter characteristics is given below.

Through A.C. coupling, it has been found that this accuracy requirement can be met over process variation. However, the series impedance of the signal source must be small compared to the A.C. impedance of the VCO control line (net). The control net of the VCO can be the output of an operational amplifier. In such cases, the series impedance of the signal source must be small compared to the output resistance of the operational amplifier. Since in CMOS technologies for example, capacitors can be realized with high accuracy over all process variations, such an A.C. coupling scheme is thus readily and effectively realized by integrating the capacitor on-chip and thereby avoiding the need for extra off-chip components. Nevertheless, an external capacitor can be used if need be.

The sinusoidal modulating signal is provided by a sinusoidal signal generator 4. This sinusoidal signal generator can be realized on the same IC as the CRU under test. However, if the available resources do not allow for such a generator to be fabricated on the same chip, the generator can be an off-chip source. Some jitter specifications may require that the source generate a sinusoid of precise amplitude and frequency. The precise amplitude requirement may preclude the on-chip signal source due to a relatively large area that would be required to realize such a source.

As such sources are not necessarily found in the types of ICs such as transceiver ICs where CRUs are found, the required area for integrating the signal source may not be easily justified. In that case, an external signal source can be used.

A simplification of the scheme arises by eliminating the signal generator, or effectively making it a null generator. In that case, a non-jittered clock is generated by the CSU and the following steps remain the same except that the test then effectively becomes a simple frequency test as opposed to a jitter tolerance test.

The jittered clock signal from the CSU 6 should be fed to the data stream generator 2 that in turns generates a data stream against which the CRU 1 is tested for clock recovery and tolerance to jitter. Such a data generator can be chosen to be a digital pseudo random data generator realized as a digital finite state machine with feedback. A well known example of the same is a linear feedback shift register (LFSR). However, this does preclude the clock being fed to other data sources, such as digital logic producing specific protocol data formats, like SONET frames.

Thus, supplying the jittered clock to the data generator results in a data stream that has same jitter characteristics as the clock. The data stream with imposed jitter is then fed as a test input stream to the CRU. The CRU recovers the clock and data from the input data stream. The recovered data from CRU is fed to a bit error rate detection circuit 3 (BERT). The error detection circuit 3 checks the recovered data stream for bit errors, the output thereof being an indication of the bits in error. Several realizations of such error detectors can be found in practice. An example of the same is described in U.S. Pat. No. 5,418,789. The output of the error detector circuit 3 is used to generate a pass/fail signal for the CRU block.

The total area overhead of the BIST scheme is minimal. The scheme requires essentially four blocks. i.e., a CSU 6, a data generator 2, a BERT 3, and a modulating signal generator 4, as well as a coupling capacitor 5. As mentioned earlier, the CSU is normally already found on the IC. As for the data generator and BERT, these simple circuits can easily be implemented using well known techniques, and thus do not constitute excessive overhead per se. Regarding the signal generator, if the integration of the latter is judged excessive, the scheme can still be implemented using a readily available external generator. Finally, the control required for implementing the present invention is simple and incurs insignificant overhead.

It should be noted that the signal generator 4 can be implemented in several ways to obtain arbitrary waveforms. The signal generator can be an off-chip or an on-chip entity.

In some cases, a part of the test circuitry can be realized using existing circuitry which form a part of the normal functionality of the IC under test. In the test mode the existing blocks may be multiplexed to be used as a part of the test setup. An example of such a case is a class of data transceiver ICs which include a mechanism for generating pseudo random data and performing BER tests as a part of the normal functionality of the IC. For such an IC a separate data generator and BER tester is not required to perform the present invention. An existing data generator and error detector can be multiplexed as a part of the test circuitry.

Similarly, in some other cases, all or some other blocks used for the present invention may already be present on the IC as a part of the normal functionality of the IC. Regardless of the actual location (off-chip or on-chip) and intended original use (normal operation or test mode) of the blocks, this invention applies to all such cases without departing from the basic spirit of the invention.

Figure 4:
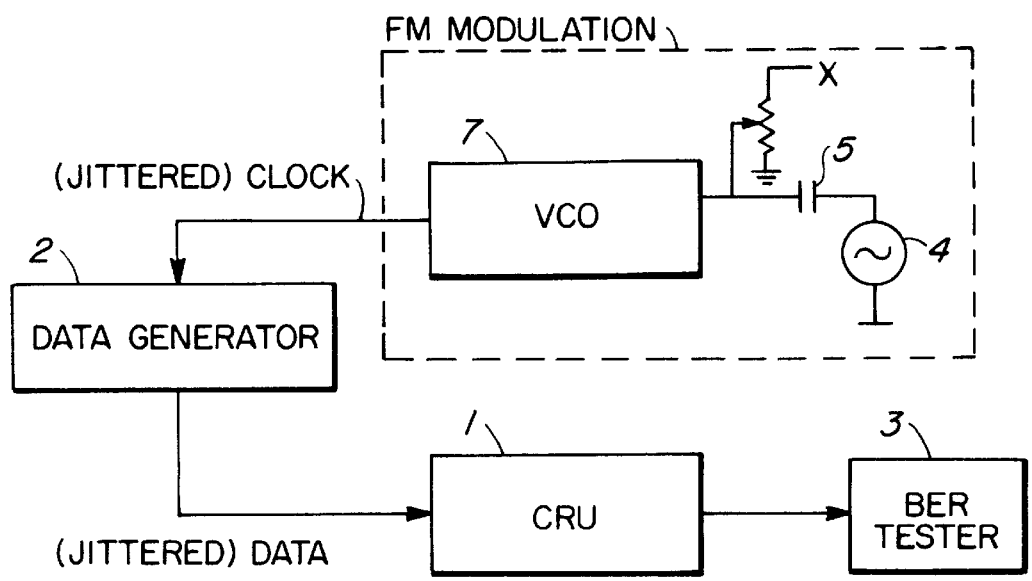

FIG. 4 illustrates another embodiment of the invention. In this embodiment, instead of the VCO being contained in a phase locked loop, it is a stand-alone unit. The signal generator 4 is A.C. coupled via capacitor 5 to the control input of VCO 7, and angle (phase or frequency) modulates the D.C. control voltage applied thereto (not shown). The D.C. control voltage can be provided by any conventional means, such as from the tap of a potentiometer or other voltage divider connected between two opposite poles of a power supply. The output of the VCO 7 is connected to the clock input of the data generator 2.

With the application of the frequency modulated signal to the control voltage of the VCO 7, its output is a clock signal containing jitter. The remainder of the system operates in a manner similar to the system of FIG. 2.

The advantage of this embodiment is the high input impedance of the VCO control net. This simplifies the application of control voltage to the VCO. However, due to the high gain of the VCO, a rather precise signal source is required as compared to the one used in the embodiment of FIG. 2.

The procedure for converting a typical SONET/SDH jitter tolerance specification into an equivalent angle modulation, in general, and frequency modulation, in particular is as follows:

Let $x_c(t)$ in Eq. (1) be an unmodulated clock signal whose angular frequency is $\omega_c$.

$$x_c(t)=\cos\{w_c t\} \quad (1)$$

Then, Let $x_m(t)$ in Eq. (2) represent the modulating signal used to frequency modulate the carrier $x_c(t)$, where $\omega_m$ is the angular frequency of the modulating signal, and $A_m$ is the amplitude of the modulating signal.

$$x_m(t)=A_m \cos(w_m t) \quad (2)$$

$x_{mod}(t)$ Eq. (3) thus represents the modulated or the jittered clock signal, where k represents the depth of modulation. The maximum value of the argument $kx_m(t)$ is equal to the angle corresponding to the time domain value given in the jitter specification. The corresponding angle value is obtained by multiplying the time value by $\pi$. Hence, for a jitter amplitude of $J_{pp}$ unit interval (UI), thus corresponding angle value, is $J_{pp}\times\pi$. This is used to obtain Eq. (4) from Eq. (3).

$$x_{mod}(t)=\cos\{w_c t+kx_m(t)\} \quad (3)$$

$$X_{mod}(t)=\cos\{w_c t+J_{pp}.\pi.x_m(t)\} \quad (4)$$

It is known from the theory of angle modulation that a frequency modulated wave with a peak frequency deviation of $\Delta f$ is equivalent to a phase modulated wave with a peak angle deviation of $\Delta f/f_m$, where $\Delta f/f_m$ is called the modulation index. Hence, the amplitude of jitter and the angle modulation index are related as given in Eq. (5).

$$J_{pp}\times\pi=\Delta f/f_m \quad (5)$$

Let $k_f$ be the gain of the voltage controlled oscillator (VCO) in the CSU PLL. The deviation in output frequency of the VCO is given by Eq. (6). Using Eqs. (6) and (5), we obtain Eq. (7). The amplitude of the modulating signal required to impose a jitter of value $J_{pp}$ on the clock is determined by Eq. (7).

$$\Delta f = k_f \times A_m \quad (6)$$

$$J_{pp} = \frac{k_f \times A_m}{\pi \times f_m} \quad (7)$$

Equation (7) can be construed as being modified by parasitic effects, in which the right side of the equation is multiplied by S1, a parasitic effect variable.

Thus, a sinusoid with a frequency of $f_m$ and amplitude $A_m$ (given by Eq. (7)) will impose a desired jitter of $J_{pp}$ UI at frequency $f_m$, on a carrier given by Eq. (1).

Figure 1:
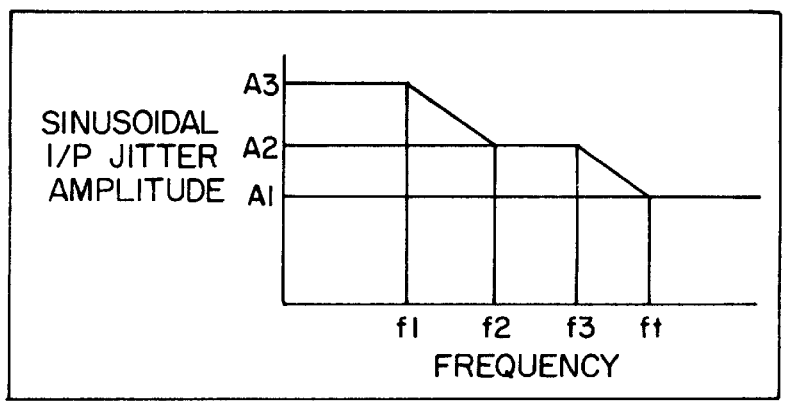

As a numeric example, consider one of the points on the ANSI T1.105.03-1994 jitter specification (e.g. FIG. 1), say, 0.15 UI maximum jitter at 250 kHz. 0.15 UI maximum jitter at 250 kHz means that the edges of the jittered signal are sinusoidally shifting away from their corresponding edges of the non-jittered signal at a rate of 250 kHz. Since the modulating signal is being assumed sinusoidal, the jitter reaches a maximum at π. At this point the corresponding edges are apart in time by 0.15 UI. In the time domain this means that the edges are apart by 0.241 ns, as the time period of a 622 MHz clock is 1.6075 ns.

To impose the given jitter on a 622.08 MHz clock signal, frequency modulation is performed with a sinusoid of 250 kHz frequency. The amplitude of the sinusoid is determined by the maximum value of angle deviation. The corresponding value of maximum angle deviation is 0.15×π=0.4712 rad. This corresponds to $\Delta f/f_m$. Hence, the value of $\Delta f$ is 117.8 kHz.

Suppose the gain of the VCO is 100 MHz/V. The required amplitude of the sinusoid is then obtained from Eq. (6). In this case, the amplitude will be 1.17 mV. the amplitude of the sinusoid can be directly obtained from Eq. (7) also. Hence, a sinusoid with a frequency of 250 kHz and amplitude 1.17 mV will impose a desired jitter of 250 kHz and 0.15 UI on a 622.08 MHz clock signal.

A person understanding this invention may now conceive of alternative structures and embodiments or variations of the above. All those which fall within the scope of the claims appended hereto are considered to be part of the present invention.

We claim:

1. A jitter test system for testing a clock and data recovery unit (CRU) comprising:

(a) a data generating means, (b) means for clocking the data generating means with a jittered clock having a predetermined jitter, (c) means for applying a stream of data generated by the data generating means that has been jittered by the jittered clock to an input of the CRU, and (d) means for detecting the bit error rate of the data signal output from the CRU.

2. A test system as defined in claim 1 in which the clocking means is comprised of a voltage controlled oscillator (VCO) for generating a clock signal, and an A.C. sine wave signal source A.C. coupled to a control input of the VCO for varying the frequency or phase of the clock signal at a predetermined rate.

3. A test system as defined in claim 2 in which the VCO is a stand-alone unit.

4. A test system as defined in claim 3 in which the A.C. sine wave signal source has a series impedance which is small relative to the A.C. impedance of the input of the VCO.

5. A test system as defined in claim 2 in which the VCO is contained in a phase locked loop, said phase locked loop being comprised of a control network connected to a control input of the VCO.

6. A test system as defined in claim 5 in which the A.C. sine wave signal source has a series impedance which is small relative to the A.C. impedance of the said control input network phase locked loop.

7. A test system as defined in claim 6 in which said phase locked loop comprises a phase detector, a low pass filter having an input connected to an output of the phase detector, an output of the low pass filter connected to the control input of the VCO comprising said control input network, the sine wave signal source being A.C. coupled to the control input of the VCO, an output of the VCO and a source of a reference clock signal being connected to respective inputs of the phase detector, and the output of the VCO providing said stream of data jittered by the jittered clock.

8. A test system as defined in claim 7 including capacitor means for A.C. coupling said signal source to the control input of the VCO.

9. A test system as defined in claim 2 in which said VCO is contained in a phase locked loop, the phase locked loop including a phase detector for comparing phases of said clock signal generated by the VCO with a reference clock, means for applying a predetermined D.C. voltage to the control input, and means for applying a signal emitted from the phase detector to said control input as said D.C. voltage.

10. A test system as defined in claim 1 in which the jittered clock output has an amplitude $A_m$ and a frequency $f_m$ which are related to a predetermined value of jitter $J_{pp}$ by the expression $$J_{pp} = \frac{k_f \times A_m}{\pi \times f_m}$$

where $k_f$ represents the gain of the VCO.

11. A method of testing a clock and data recovery unit (CRU) comprising:

(a) generating a jittered clock having a predetermined jitter, (b) using the jittered clock to generate a test data stream, (c) feeding the test data stream to the CRU under test, (d) recovering a data stream from an output of the CRU, and (e) determining from the recovered data stream from the output of the CRU the bit error rate contained therein, whereby said bit error rate provides an indication of the tolerance of the CRU to jitter.

12. A method as defined in claim 11 in which the step of generating a jittered clock is comprised of A.C. coupling an A.C. signal to a control input of a voltage controlled oscillator (VCO), and providing an output signal or the VCO to a data generator as the jittered clock.

13. A method as defined in claim 11 including phase detecting an output signal of the VCO with a reference clock to provide a substantially D.C. control signal, and applying said control signal to the VCO control input.

* * * * *